United States Patent [19]

McLeod, Jr.

[11] 4,095,178
[45] June 13, 1978

[54] TACHOMETER CIRCUIT

[75] Inventor: Fenwick R. McLeod, Jr., Prospect Heights, Ill.

[73] Assignee: Sun Electric Corporation, Chicago, Ill.

[21] Appl. No.: 734,646

[22] Filed: Oct. 21, 1976

[51] Int. Cl.² .................................................. G01R 13/42
[52] U.S. Cl. ........................................ 324/169; 324/16 R
[58] Field of Search ....................... 324/169, 170, 16 R

[56] References Cited

U.S. PATENT DOCUMENTS

| | | | |
|---|---|---|---|
| 3,369,178 | 2/1968 | Wilson | 324/169 |
| 3,473,119 | 10/1969 | Mazurkevics | 324/169 |
| 3,559,063 | 1/1971 | Galletti | 324/169 |
| 3,572,302 | 3/1971 | Wollesen | 324/169 X |
| 3,588,698 | 6/1971 | Ashcraft | 324/169 |

*Primary Examiner*—Palmer C. Demeo
*Assistant Examiner*—Vincent J. Sunderdick
*Attorney, Agent, or Firm*—Allegretti, Newitt, Witcoff & McAndrews

[57] ABSTRACT

The disclosure describes an improved tachometer for displaying the speed of an engine which produces ignition pulses. The tachometer includes a pulse-forming circuit, a meter, and a capacitor connected in series with the meter. A rectifier enables the transmission of a current pulse through the capacitor and meter in response to each timing pulse. A discharge device momentarily interconnects the opposed plates of the capacitor in response to the terminal of each timing pulse, whereby the voltage on the capacitor is dissipated. The meter indicates the speed of the engine by responding to the frequency of the current pulses. The discharge device includes a diode and transistor connected across the capacitor.

6 Claims, 7 Drawing Figures

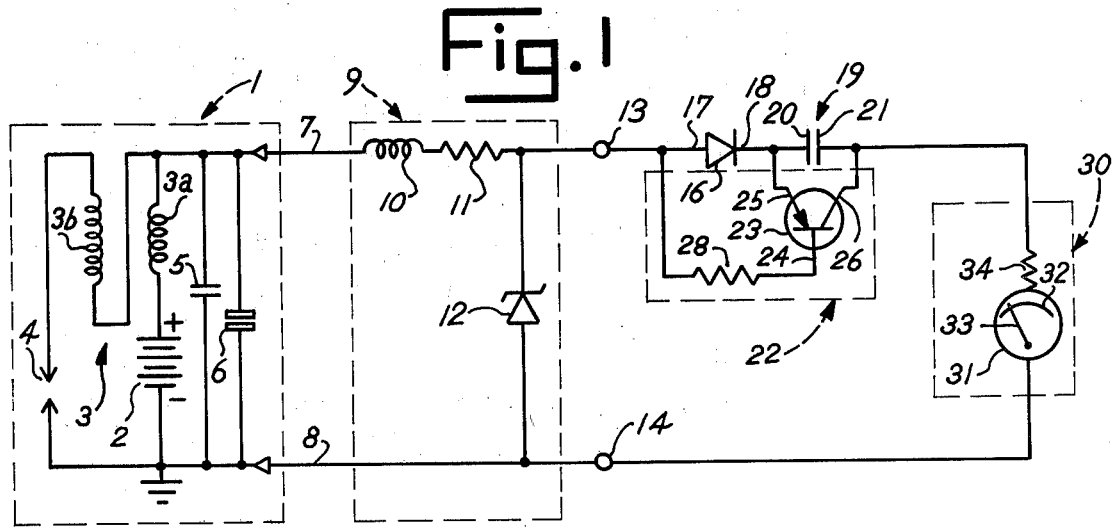
Fig. 1
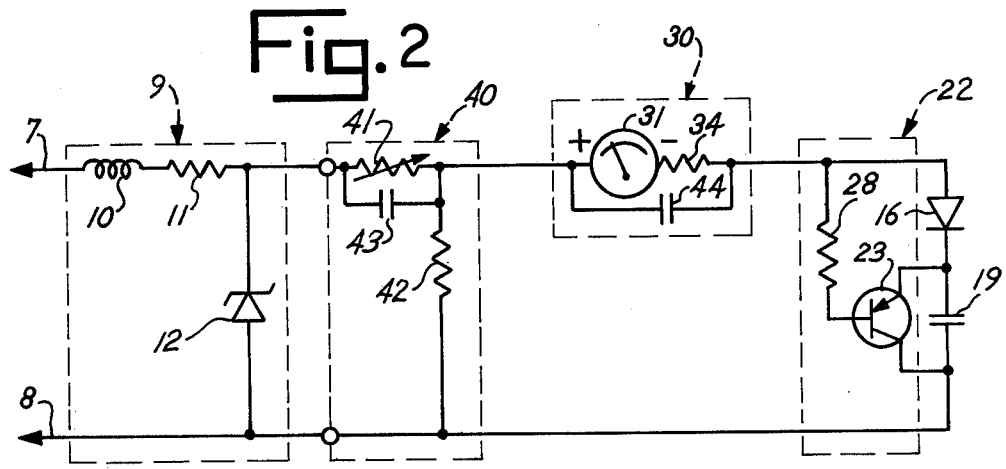
Fig. 2
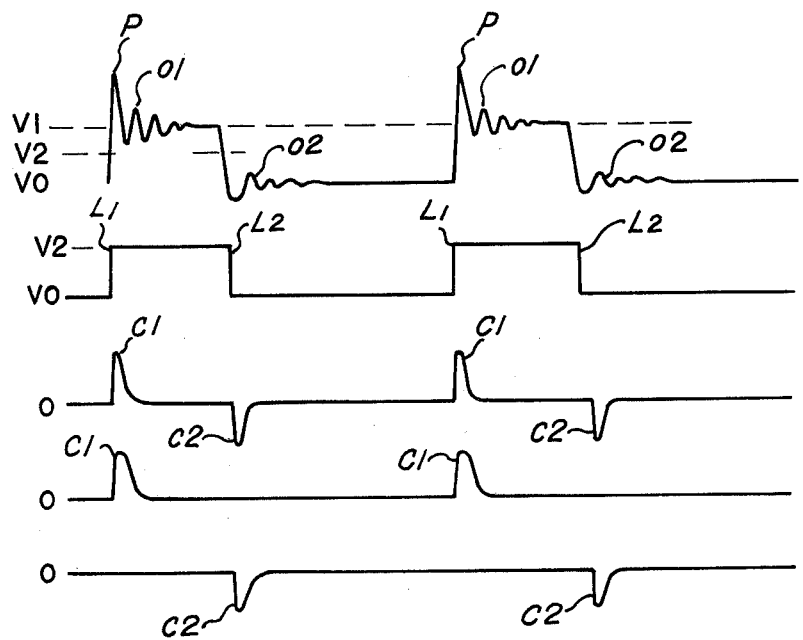
Fig. 3
Fig. 4
Fig. 5
Fig. 6
Fig. 7

TACHOMETER CIRCUIT

BACKGROUND AND SUMMARY OF THE INVENTION

This invention relates to tachometers, and more particularly relates to tachometers for displaying the speed of an internal combustion engine.

A number of circuits have been devised for use as tachometers in connection with internal combustion engines, but each has exhibited limited accuracy and relatively high cost which has discouraged its use. For example, U.S. Pat. No. 3,219,926 (Dion-Nov. 23, 1965) describes a tachometer utilizing a Zener diode-inductor filter which is responsive to ignition coil primary voltage waveforms. The Dion filter produces a relatively rectangular pulse from each primary voltage waveform which is used to charge a capacitor 24. Capacitor 24 is discharged through a meter movement which indicates the speed of the engine. In order to operate at high speed, capacitor 24 must be rapidly discharged. If the discharge period is too long, the current pulse resulting from the trailing edge of one primary voltage waveform interferes with the current pulse resulting from the leading edge of the next primary voltage waveform, and the tachometer readings become inaccurate.

Two techniques can be used to reduce the capacitor discharge time. Firstly, the value of capacitor 24 can be lowered. However, this technique reduces the energy available to drive the Dion meter movement 27, and a more sensitive and costly meter must be employed. Secondly, the resistance of meter 27 can be decreased. This technique would increase the sensitivity of the meter, but also would increase its cost. Both of the foregoing techniques would result in a more expensive circuit.

The Dion circuit requires components with relatively close tolerances. For example, capacitor 24 must be held to a reasonably close tolerance and must have a relatively large value if an inexpensive and insensitive meter movement is used.

It has been found that the disadvantages of the prior art can be overcome by employing a pulse-forming means for removing at least some of the oscillations from the ignition pulses generated by an engine to form corresponding timing pulses. A meter capable of displaying the rate at which current pulses are received is also employed, although the meter may be an inexpensive low sensitivity type. A capacitor having first and second plates is connected in series with the meter, and a rectifier enables the transmission of a current pulse through the capacitor and meter in response to each timing pulse, so that the capacitor is charged to a predetermined voltage during each timing pulse. A discharge device momentarily interconnects the first and second plates of the capacitor in response to the termination of each timing pulse. When the first and second plates are momentarily interconnected, the voltage on the capacitor is dissipated without transmitting current through the meter. As a result, the meter receives current pulses flowing in only one direction so that the speed of the engine can be indicated depending on the frequency with which the current pulses are received by the meter.

The foregoing techniques offer a number of advantages over the prior art. A relatively insensitive, low-cost meter movement can be employed, and the charging capacitor can have a relatively low value and large tolerance. In addition, the use of this circuitry enables the rapid discharge of the capacitor, so that the tachometer can operate at high rates of engine speed.

DESCRIPTION OF THE DRAWINGS

These and other advantages and features of the invention will hereafter appear in connection with the accompanying drawings wherein like numbers refer to like parts throughout and wherein:

FIG. 1 is a schematic diagram of a preferred form of tachometer circuit made in accordance with the present invention and shown in connection with an exemplary ignition circuit;

FIG. 2 is a schematic diagram of an alternative embodiment of the invention which employs a calibration circuit;

FIG. 3 is a voltage waveform of exemplary primary voltages received from the ignition circuit shown in FIG. 1;

FIG. 4 is a voltage diagram illustrating the timing pulses produced by the pulse-forming circuit shown in FIG. 1;

FIG. 5 is a current waveform illustrating the current pulses flowing through plate 20 of capacitor 19 in response to the timing pulses shown in FIG. 4;

FIG. 6 is a current waveform illustrating the current pulses flowing through meter 31 in response to the timing pulses; and FIG. 7 is a current waveform illustrating the current flowing through transistor 23 in response to the timing pulses.

DESCRIPTION OF THE PREFERRED EMBODIMENT

Referring to FIG. 1, a tachometer made in accordance with the present invention can be used in connection with an internal combustion engine employing an exemplary ignition system 1. The system includes a spark plug 4 which is connected between ground and the high-voltage winding 3b of a conventional ignition coil 3. Distributor contact points 6 are connected in series with the primary windings 3a of coil 3 and a storage battery 2. A distributor condenser 5 is connected in parallel with contact points 6. In a well-known manner, contact points 6 are operated in synchronism with an internal combustion engine (not shown) in order to produce ignition pulses which fire spark plug 4.

Referring to FIG. 1, a preferred form of tachometer made in accordance with the present invention basically comprises a pulse-forming circuit 9, a rectifier 16, a capacitor 19, a discharge circuit 22 and a meter circuit 30. More specifically, pulse-forming circuit 9 comprises an inductor 10, a resistor 11 and a Zener diode 12 connected as shown. Circuit 9 is connected across contact points 6 by leads 7 and 8. In a known manner, circuit 9 removes at least some of the oscillations from the ignition pulses shown in FIG. 3 in order to produce relatively rectangular timing pulses of the type shown in FIG. 4. The output of circuit 9 appears across terminals 13 and 14. Rectifier 16 comprises a diode having an anode 17 and a cathode 18. Capacitor 19 includes a first plate 20 and a second plate 21 capable of storing charge. Discharge circuit 22 comprises a conventional transistor 23 having a base element 24, an emitter 25 and a collector element 26. The emitter element is connected to the first plate of capacitor 19 and the collector element is connected to the second plate of the capacitor.

Base element 24 is biased by a resistor 28 which is connected to the anode of diode 16.

Meter circuit 30 includes a conventional meter 31 having a coil winding (not shown) which deflects a pointer 33 in response to the current flowing through the winding. The pointer deflection is measured by a scale 32 which reads in rpm. The meter also is controlled by the conventional resistor 34.

The circuitry shown in FIG. 1 operates as follows. In a well-known manner, ignition circuit 1 produces a series of primary voltage waveforms, two of which are shown in FIG. 3. As soon as contact points 6 open, a positive pulse P is produced. Superimposed on the pulse is an oscillatory signal 01 having a resonant frequency determined by the values of the leakage reactance of primary winding 3a and capacitor 5. Signal 01 decays toward a voltage level V1 which is equal to the potential of battery 2. Although signal 01 has been shown for convenience with relatively small amplitude, it may include peaks such as P, which are much greater in magnitude than the voltage of battery 2. In response to the closing of contact points 6, the primary ignition waveform voltage falls from level V1 to V0. At this time, another oscillatory signal 02 is produced which decays toward ground potential (i.e., V0).

Pulse-forming circuit 9 removes most, if not all, of the oscillatory signals in the primary ignition waveform in order to produce a relatively rectangular series of timing pulses shown in FIG. 4. The timing pulses switch between voltage V0 and another voltage V2 which is slightly lower than the voltage of battery 2. The timing pulses shown in FIG. 4 appear across terminals 13 and 14 (FIG. 1). In response to the leading edge of a timing pulse L1, diode 16 conducts current through capacitor 19 and meter 31. As soon as capacitor 19 has charged to voltage V2, the current stops flowing. As a result, a series of positive current pulses C1 are conducted through capacitor 19 and meter 31, one current pulse for each leading edge of a timing pulse. The current pulses conducted through the meter and capacitor 19 are shown in FIG. 6.

In response to the trailing edge of each timing pulse L2, diode 16 is reverse-biased due to the voltage on plate 20 of capacitor 19. In addition, since the anode of diode 16 is at a lower voltage than the cathode of diode 16, transistor 23 is switched to its conductive state so that plates 20 and 21 of capacitor 19 are interconnected through the emitter-collector junction of the transistor. As a result, the charge difference between plates 20 and 21 of capacitor 19 is equalized without causing a current pulse to flow through meter 31. The current pulses C2 flowing through transistor 23 in response to the trailing edges of the timing pulses are shown in FIG. 7. The positive and negative pulses of current flowing through plate 20 of capacitor 19 are shown in FIG. 5. A positive pulse C1 flows in response to the leading edge of each timing pulse and a negative pulse C2 flows in response to the trailing edge of each timing pulse.

Transistor 23 is an important feature which enables the rapid discharge of capacitor 19. The arrangement of diode 16 is also an important feature which enables the rapid charging of capacitor 19 by using an inexpensive component. By using the foregoing techniques, current pulses of short duration and sufficient amplitude to drive an inexpensive meter 31 can be used to determine engine speed accurately over a large range of rpm.

FIG. 2 illustrates a modification of the circuitry shown in FIG. 1 in which a calibrating circuit 40 is connected between pulse-forming circuit 9 and meter circuit 30. The calibration circuit includes a potentiometer 41, a resistor 42 and a bypass capacitor 43 connected as shown. In addition, when the calibration circuit is employed, a capacitor 44 is connected in parallel with meter 31 so that additional time constants are not introduced into the charging and discharging circuits of capacitor 19 during the duration of the timing pulses. Potentiometer 41 may be adjusted in order to increase or decrease the amplitude of the timing pulses shown in FIG. 4. By adjusting the amplitude of the timing pulses, meter 31 may be calibrated in order to accurately display the speed of the engine incorporating ignition circuit 1 depending on the frequency of the primary ignition waveforms received from circuit 1.

Those skilled in the art will recognize that the preferred embodiments disclosed herein may be altered and modified without departing from the true spirit and scope of the invention as defined in the appended claims.

What is claimed is:

1. A tachometer for displaying the speed of an engine including an ignition circuit for producing ignition pulses containing oscillations comprising in combination:

pulse-forming means for removing at least some of the oscillations from the ignition pulses to form corresponding timing pulses;

meter means for displaying the speed of the engine in response to the timing pulses;

a first capacitor connected in series with the meter means, said capacitor having a first plate and a second plate for accumulating charge;

rectifier means for enabling the transmission of a current pulse through the first capacitor and meter means in response to each timing pulse, whereby the first capacitor is charged to a predetermined voltage during each timing pulse; and discharge means for momentarily interconnecting the first and second plates of the first capacitor in response to the termination of each timing pulse, whereby the voltage on the first capacitor is dissipated without transmitting a current pulse through the meter, so that the meter indicates the speed of the engine in response to the timing pulses.

2. A tachometer, as claimed in claim 1, wherein the pulse-forming means comprises:

a Zener diode connected in parallel with the ignition circuit;

an inductor connected between the ignition circuit and the Zener diode; and a resistor connected in series with the inductor.

3. A tachometer, as claimed in claim 1, wherein the rectifier means comprises a diode connected in series with the first capacitor, said diode including an anode and also including a cathode operatively connected to the first plate of the first capacitor.

4. A tachometer, as claimed in claim 3, wherein the discharge means comprises:

a transistor having an emitter, base and collector;

first means for connecting the emitter to the first plate of the first capacitor;

second means for connecting the collector to the second plate of the first capacitor; and a resistor connected between the base and the anode of the diode.

5. A tachometer, as claimed in claim 1, and further comprising means for calibrating the amplitude of the timing pulses.

6. A tachometer, as claimed in claim 5, wherein the means for calibrating comprises:

a resistor connected in series between the pulse-forming means and the meter means;
a second resistor connected in parallel between the pulse-forming means and the meter means; and
a second capacitor connected across the meter means.

* * * * *